United States Patent
Xu

(10) Patent No.: US 7,687,977 B2
(45) Date of Patent: Mar. 30, 2010

(54) MICROMACHINED, PIEZOELECTRIC VIBRATION-INDUCED ENERGY HARVESTING DEVICE AND ITS FABRICATION

(75) Inventor: Zheng Yi-Daniel Xu, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 529 days.

(21) Appl. No.: 11/402,017

(22) Filed: Apr. 10, 2006

(65) Prior Publication Data
US 2007/0284969 A1    Dec. 13, 2007

(51) Int. Cl.
H01L 41/08    (2006.01)
(52) U.S. Cl. .................................. 310/339; 310/331
(58) Field of Classification Search ......... 310/330–332, 310/339
See application file for complete search history.

(56) References Cited

U.S. PATENT DOCUMENTS

| | | | | |
|---|---|---|---|---|
| 3,456,134 | A * | 7/1969 | Ko | 607/35 |
| 5,072,288 | A * | 12/1991 | MacDonald et al. | 257/420 |
| 5,801,475 | A | 9/1998 | Kimura | |
| 6,252,336 | B1 * | 6/2001 | Hall | 310/339 |
| 6,938,311 | B2 * | 9/2005 | Tanielian | 29/25.35 |
| 7,057,330 | B2 * | 6/2006 | Buhler et al. | 310/339 |
| 7,157,835 | B2 * | 1/2007 | Sakai | 310/339 |
| 7,176,601 | B2 * | 2/2007 | Tanaka et al. | 310/339 |
| 7,245,062 | B2 * | 7/2007 | Schmidt | 310/339 |
| 7,414,351 | B2 * | 8/2008 | Ulm et al. | 310/330 |
| 2002/0043895 | A1 | 4/2002 | Richards et al. | 310/328 |
| 2005/0140212 | A1 | 6/2005 | Hamel et al. | 307/44 |
| 2005/0225213 | A1 | 10/2005 | Richards et al. | 310/339 |
| 2006/0087200 | A1 * | 4/2006 | Sakai | 310/339 |
| 2007/0114890 | A1 * | 5/2007 | Churchill et al. | 310/339 |
| 2007/0125176 | A1 | 6/2007 | Liu | |
| 2007/0188053 | A1 * | 8/2007 | Stark | 310/339 |
| 2008/0100180 | A1 * | 5/2008 | Clingman et al. | 310/339 |

FOREIGN PATENT DOCUMENTS

| | | |
|---|---|---|
| EP | 0725452 A1 | 8/1996 |
| WO | WO 01/20760 A1 | 3/2001 |
| WO | WO 02/084754 A2 | 10/2002 |
| WO | WO 02/084754 A3 | 10/2002 |

(Continued)

OTHER PUBLICATIONS

S. Roundy, P.K. Wright, J. Rabaey, *A Study of Low-Level Vibrations as a Power Source for Wireless Sensor Nodes*, Computer Communications 26 (2003) pp. 1131-1144.

(Continued)

*Primary Examiner*—J. SanMartin
(74) *Attorney, Agent, or Firm*—Kris T. Fredrick; Luis M. Ortiz; Kermit D. Lopez

(57) ABSTRACT

A micro-sized power source. A piezoelectric power generator, capable of harvesting energy from environmental vibration with lower level frequency, including a dielectric frame loosely containing a piezoelectric panel. The piezoelectric panel includes an electrode and a piezoelectric layer formed over an electrode and dielectric layer and an end mass formed on the piezoelectric layer. The end mass provides weight to cause the piezoelectric panel to move (vibrate) within the frame and causes the generation of electrical power.

16 Claims, 4 Drawing Sheets

FOREIGN PATENT DOCUMENTS

WO WO 2004/077652 A1 9/2004

OTHER PUBLICATIONS

N.S. Shenck, J.A. Paradiso, *Enemy Scavenging With Shoe-Mounted Piezoelectrics*, MIT Media Laboratory, Responsive Environments Group, pp. 30-42.

P.Glynne-Jones, S.P. Beeby and N.M. White, *Towards a Piezoelectric Vibration-Powered Microgenerator*, IEE Proc.-Sci Meas. Technol., vol. 148, No. 2, Mar. 2001, pp. 68-72.

A MEMS-Based Piezoelectric Power Generato for Low Frequency Vibration Energy Harvesting; Fang, H.B, Liu, J.Q., Xu, Z.Y., Dong, L., Chen, D., Cai, B.C., Liu, Y.; Chin.Phys.Lett. vol. 23, No. 3 (2006).

Fabrication and Performance of MEMS-Based Piezoelectric Power Generator for Vibration Energry Harvesting; Fang, H.B., Liu, J.Q., Xu, Z.Y., Wnag, L., Chen, D., Cai, B.C., Liu, Y.; Microelectronics Journal 37 (2006) 1280-1284.

PCT—Notification of Transmittal of The International Search Report and The Written Opinion of the International Searching Authority, or the Declaration, Date of Mailing Aug. 17, 2007.

\* cited by examiner

MICROMACHINED, PIEZOELECTRIC VIBRATION-INDUCED ENERGY HARVESTING DEVICE AND ITS FABRICATION

TECHNICAL FIELD

Embodiments described herein are related to micro power sources. More particularly, embodiments described herein are related to vibration-induced micromachined power harvesting/generating devices. Embodiments are also related to methods of fabricating vibration-induced micromachined power harvesting/generating devices.

BACKGROUND OF THE INVENTION

Wireless sensor networks provide promising solutions for broad areas of use ranging from building monitoring to medical implants applications. Wireless sensors provide advantages during wide use of cost savings, installation simplicity, remote control, etc. The problem associated with the concept of a wireless network, however, lies with determining how to supply power to contactless, embedded sensors.

Batteries are automatically thought to be a solution for providing power to remote device, but such power sources are limited by their finite lifetime. In addition, sensor nodes tend to be portable and integrated with multi-functions, therefore, limited power issues, small size and integration capabilities pose additional problems in front of the effective implementation of a promising wireless sensor network.

The present inventor believes what are needed are solutions for scavenging energy from the environment, eliminating the need of batteries and extending a device's operating lifetime infinitely. Advances in low power VLSI design, along with the low duty cycles of miniaturized wireless sensors have reduced power requirements to the range of microwatts. In such range of consumption, power supplied by energy harvesting could be a viable alternative. Possible energy sources for use with systems in the micro-domain include solar, thermal, mechanical, human body and wind.

With advances in MEMS technology, the present inventor believes it is now possible to implement a self-powered system together with MEMS devices acting as an electromechanical transducer with conversion governed by employing low power digital control techniques, while keeping the whole system in a small-sized package. Therefore, what is required is a system, apparatus, and/or method that provides an improved power source that overcomes at least some of the limitations of previous systems and/or methods.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

In order to fulfill future power supply requirements for wireless, contactless and potentially implantable systems, the present inventor herein teaches a MEMS-based piezoelectric-type, vibration-induced energy-harvesting device. To eliminate the need of batteries, harvesting energy from ambient power sources is a promising solution. Advances in low power VLSI design, along with the low duty cycles of miniaturized wireless sensors have reduced power requirements to the range of microwatts so that power supplied by energy harvesting could be a viable alternative.

Vibrations occur ubiquitously, thus it is selected by the present inventor as the preferred power source to exact electrical energy from among three vibration-electricity conversion methods, piezoelectric, magnetic, electrostatic. The first is deemed the best solution regarding suitable voltage levels and fabrication convenience. By using advances in MEMS technology, a self-powered system including energy harvesting and power management can be co-located on the same chip as the working device, while keeping the whole system within a small-sized form factor. Therefore, a MEMS-based piezoelectric-type vibration-induced energy harvesting device is described as the best power source to fulfill the requirements of a distributed wireless sensor network.

In accordance with features of the embodiment, described is a micro-sized power source. A piezoelectric power generator including a dielectric frame loosely supporting a piezoelectric panel thereon. The piezoelectric panel includes an electrode and a piezoelectric layer formed over an electrode and dielectric layer and an end mass formed on the piezoelectric layer. The end mass provides weight to cause the piezoelectric panel to move (vibrate) within the frame and causes the generation of electrical power.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope of the invention.

Figure 1:
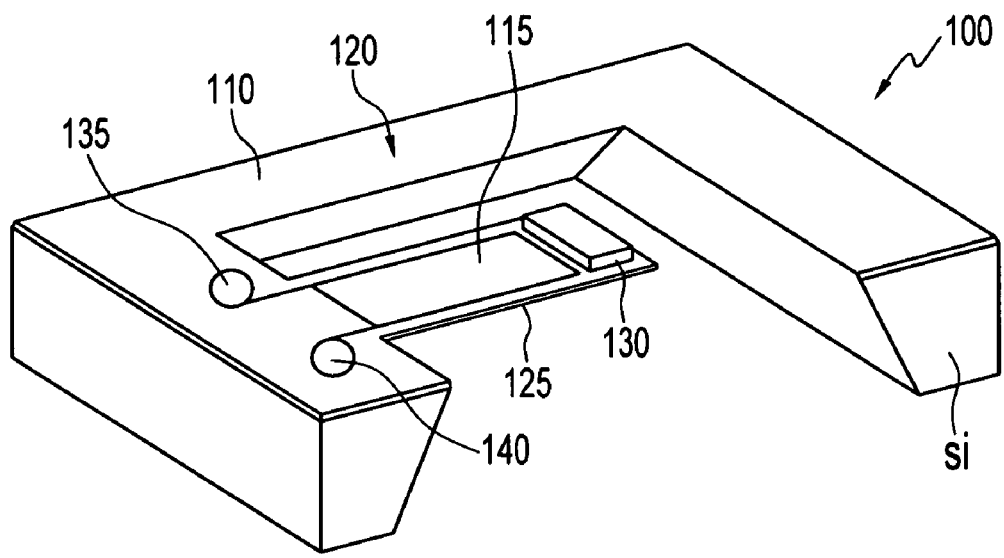
FIG. 1 illustrates a perspective view of a micromachined vibration induced piezoelectric-based energy harvesting devices in accordance with features of the embodiments.

With reference now to the figures and in particular with reference to FIG. 1, there is depicted an embodiment of a micromachined, piezoelectric power generator 100 including a dielectric frame 110 loosely supporting an integrated piezoelectric panel 125. The piezoelectric panel 125 is composed of dielectric materials and includes an electrode and can be formed as a piezoelectric layer 115 formed over an electrode. An end mass 130 provides enough weight to cause the piezoelectric panel 125 to move (vibrate) within an integrated frame 110. Movement of the panel 120 within the frame 110 causes the generation of electrical power, which can be used to power a microelectronic system such as a sensor. Generated power is taken from connection to lower pad 135 and upper pad 140.

Figure 2:
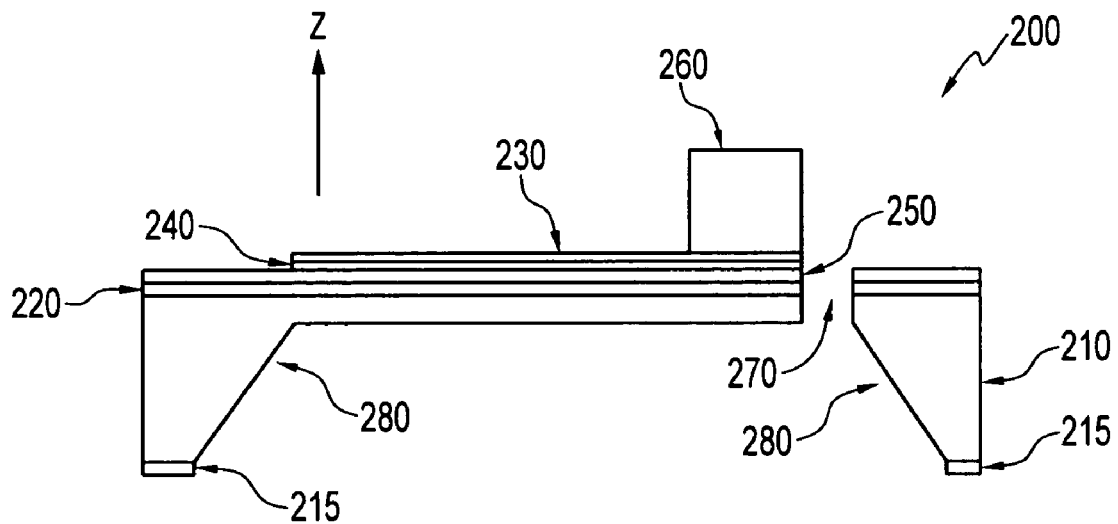
FIG. 2 illustrates a side, cross-section view of a piezoelectric panel along the cantilever in accordance with features of the embodiments.

Referring to FIG. 2, a cross-sectional view of the micronachined vibration induced piezoelectric-based energy harvesting device 200 is shown. The device 200, formed as a cantilever-like device, is fabricated on silicon wafer 210. Single crystal silicon and dielectric layers, 215 and 220, such as silicon dioxide and silicon nitride, form the mechanical supporting frame of the energy harvesting cantilever device 200. Although only one cantilever 200 is drawn in FIG. 2 to describe the working mechanism, either single cantilever or multiple cantilevers can be selected based on the target application. The cantilever is composed of, from top-down direction (Z direction), top electrode 230, which may be composed with multi-layer metals such as Pt/Ti or Au/Cr, a piezoelectric layer 240 such as PZT, bottom electrode 250, which uses the same materials as top electrode 230 or other metal materials and dielectric layers as those for supporting functions. At the free tip of the cantilever, there is an end mass 260, made of metal or other suitable ballast material. Contact pads as shown in FIG. 1 connect to top and bottom electrodes correspondingly, which are also the power out interface to an external load (e.g., rectifier, regulators, any power management systems) and loads (e.g., such as sensors and actuators). Below the cantilever, a void is formed 270 together with substantial removal of dielectric layer 280 to cause a successful movement of the cantilever when vibrating.

When stimulated by environmental vibration, such as rotary machine vibration, the cantilever is forced to vibrate along Z direction within the space of the frame. By piezoelectric effect, such movement of the cantilever generates charge in the bottom and top electrodes thus generating power through the pads to an external load. If forced vibration frequency matches natural frequency of the energy harvesting devices, maximum tip displacement will occur triggering maximum strain in the piezoelectric layers and therefore generating maximum power. The function of the end mass 260 is for enhancing vibration amplitude as well as tuning the natural frequency.

The power generator described above is unique given its micro-dimension (feature size up to several millimeter) when combined with a low frequency (<1000 Hz) vibration extracting capability. The micromachined fabrication process enables the realization of energy harvesting device of monolithic integration and systems-on-chip capability.

Thin film piezoelectric layers are preferably 0.5 micron to 10 microns thick. A single piezoelectric layer can be arrayed to realize broader frequency extracting and enhance power output.

Referring to FIGS. 3(*a*) through 3(*l*) steps for fabricating a device in accordance with the embodiments are illustrated.

FIG. 3(*a*) illustrates the start of the fabrication process for a cantilever-like device by accessing a single layer, crystalline silicon 305. A double polished single crystalline silicon wafer of a thickness of about 500 microns, plus/minus certain variance, e.g. <1%, and with certain resistivity, e.g. >10 Ohm/cm, p-type or n-type, can form the basis for constructing the present device. For the succeeding sequential process integration flow, choice of wafer phase can be considered a critical factor of influence. If employing wet etching approach to finally remove the bulk silicon by alkaline solutions, e.g. KOH or TMAH, (100) phase wafer can be the most appropriate choice and widely adopted worldwide because of operation simplicity, low cost and mastery of the etching mechanism. If employing dry etching approach to realize the silicon removal by certain process, e.g. deep reactive ion etch (DRIE), either phase wafer can be selected because the dry etching approach is mostly crystal phase insensitive.

FIG. 3(*a*) also illustrates dielectric layers 310, 312 formable by either chemical vapor deposition (CVD), oxidation or sputtering. Dielectric layers, 310, 312, may include silicon dioxide and silicon nitride or either of them, serve as the process mask during fabrication, e.g. mask to remove bulk silicon because of its comparatively very low etching rate in alkaline solutions, and as the stress compensation media to balance the internal film stress, which may be induced during thermal process and lattice mismatch, to the functional films like a piezoelectric membrane to keep the cantilever flat and straight fulfilling the performance requirement. Such dielectric layers can be deposited directly onto the two sides of raw silicon wafer with certain thickness, which can be decided by theoretical calculations regarding multi-layer stress balance purpose. Silicon dioxide is firstly formed, either deposited by, CVD or oxidized directly through thermal oxidation. One silicon dioxide layer can also serve the functions mentioned, but as to better control the process, silicon nitride is preferred to form onto the silicon dioxide layer, which can be deposited by CVD or sputtering technique.

FIG. 3(*b*) illustrates the formation of a bottom electrode 315, which can be fabricated by physical vapor deposition (PVD). After the formation of the dielectric layers, a metal layer can be deposited on one side of the water such as the bottom electrode 315 for functional membrane like piezoelectric material, Lead Zirconate Titanate (PZT). The function of the bottom electrode 315 is to provide specific optimal texture orientation according to corresponding materials above, e.g. <111> for PZT, and to serve as one plate electrode for poling process, afterwards enabling piezoelectric effect inside materials. A metal electrode can most likely be composed of platinum/titanium or gold/chromium as used ubiquitously in integrated circuit industry, with former metal thickness varied in range of several hundred nanometers, e.g. 100~400 nm, and the latter metal thickness varied in range of several hundred angstrom, e.g. 100~400 Å. PVD is the preferred processing method for deposition such as by DC or RF sputtering. As shown in FIG. 3(*c*), the bottom electrode 315 can be patterned 317 to accommodate additional layer functionality.

FIG. 3(*d*) illustrates PZT layer 320 deposition (PVD or sol-gel). After the bottom electrode formation, functional materials, herein referring to piezoelectric materials like PZT, are deposited onto the bottom electrode 315, with a thickness that can range within several microns, e.g. 0.5~10 micron. The deposition method can be PVD or by sol-gel. PVD is capable of getting controllable film uniformity and surface condition with very low sacrifice of depostion rate, but with high cost; Sol-gel is capable of getting thicker film with faster deposition rate and low cost, but with sacrifice of the surface condition and complexity of the thermal budget control during processing to enable crack-less films.

FIGS. 3(*e*) through 3(*h*) illustrate formation of a top electrode (PVD+patterning or liftoff). The PZT layer 320 is first etched 337 as shown in FIG. 3(*e*), then functional materials 330 are deposited over the PZT layer 320 and bottom electrode 315 as shown in FIG 3(*f*). As shown in FIG. 3(*g*), top electrode 335 is deposited right after the functional materials 330 formation. This layer serves as another plate electrode for poling process afterwards enabling piezoelectric effect inside materials. The composition of the electrode could be either as same as the bottom electrode, or any other metal fulfilling the requirement of intimate interlayer adhesion and afterwards packaging needs, in particular wire-bonding. The thickness ranges within several hundred of nanometers, e.g. 100~400 nm. The pattern of the top electrode could be realized as shown in FIG. 3(*h*) by using universal photolithography process after deposition including photo resist (PR) coating, pre-bake, exposure, develop, post-bake, etching-by certain liquids etchant like $KI/I_2$ to gold or by ion beam etching, and PR stripping; or realized just during PVD sputtering using so-call liftoff process, where the pattern is formed before the electrode deposition using photolithography process. After the metal deposition, the PR is removed together with the metal films above, therefore leaves the desired metal to form the top electrode 340.

FIG. 3(c) through 3(h) illustrates the bottom-up process of electrode and PZT formation. Another alternative approach is top-down process to make the same. The details are: Based on the structure shown in FIG. 3(b), it is first depositing piezoelectric layer-PZT onto the bottom electrode 315 in the same side and at whole wafer level, then depositing top electrode onto the PZT, also same side and at whole wafer level. After the patterning of the top electrode by process mentioned, functional layers-PZT can be patterned to form the basic geometry of the final cantilever. Either wet etching or dry etching process can be used to pattern the PZT, with the mask of PR and electrode. When using wet etching process, solution selection is critical because such solution should not etch the stuff all around the PZT, namely silicon, dielectric layer and metal electrode. For this process integration flow, solution composed of HF, HCL and $H_2O$ is used to do the job, which can be compatible to the micromachining process requirement as mentioned. When using dry etching process, like reactive ion etching (RIE), DRIE or inductance coupling plasma (ICP) etching technique, generally, material around the electrode will be slightly attacked. After the PZT shaped, taking PR and or PZT as the process mask, bottom electrode will be patterned in same way forming top electrode. Either bottom-up or top-down process can result in the same structure in FIG. 3(h).

FIGS. 3(i) through 3(l) illustrate the formation of a cantilever. To form the cantilever, the bulk silicon should be removed and only leave the film beam on the top side of the structure. In order to realize such purpose, photolithography can first be applied to form the etching window in the backside opposite to cantilever. Dielectric layers are removed using etching process, either wet or dry, thus the window 350 is open for the bulk micromachining and trench 345 is open for forming the cantilever from the front side.

Figure 3A:
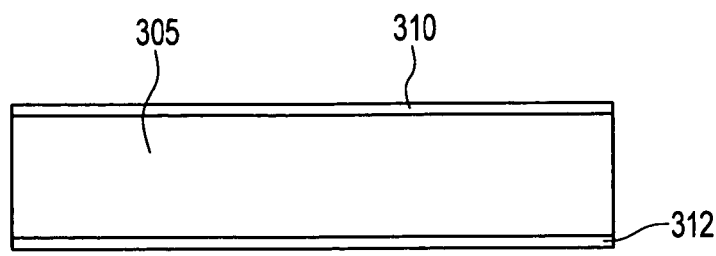
FIG. 3(*a*)-3(*l*) illustrates process steps for fabricating a device in accordance with features of the embodiments.
Figure 3B:
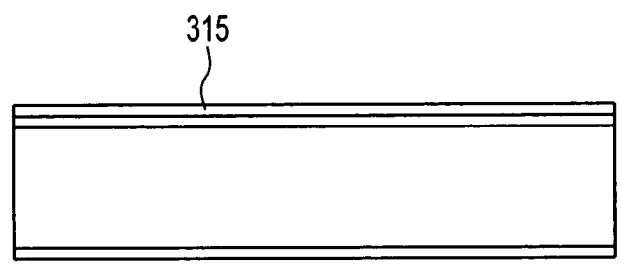
Figure 3C:
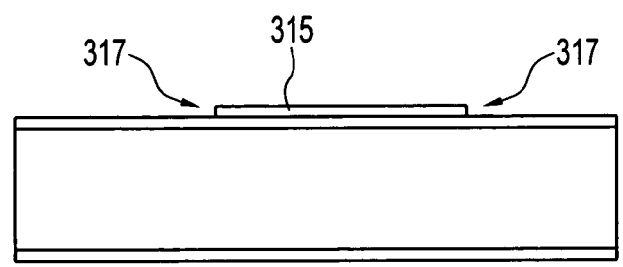
Figure 3D:
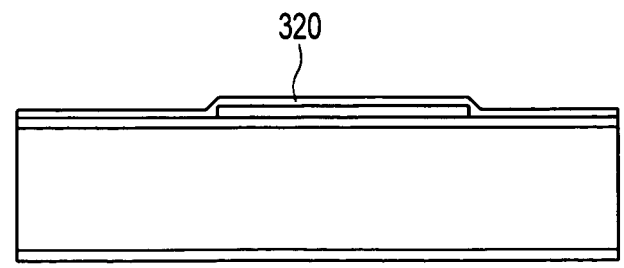
Figure 3E:
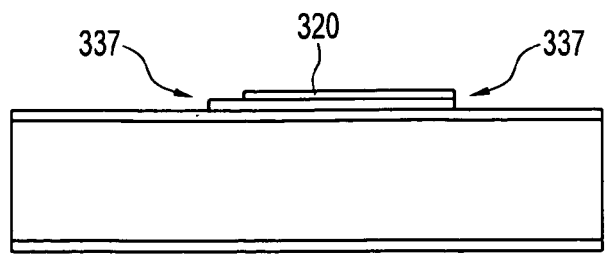
Figure 3F:
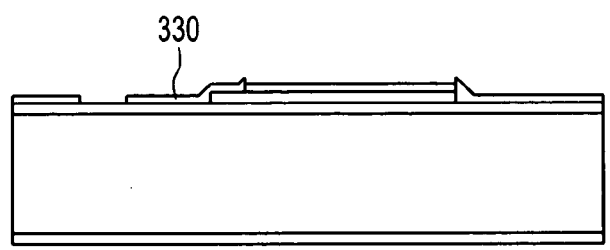
Figure 3G:
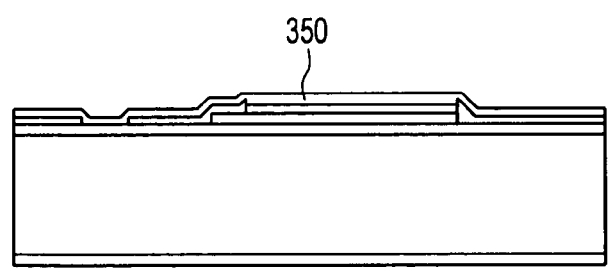
Figure 3H:
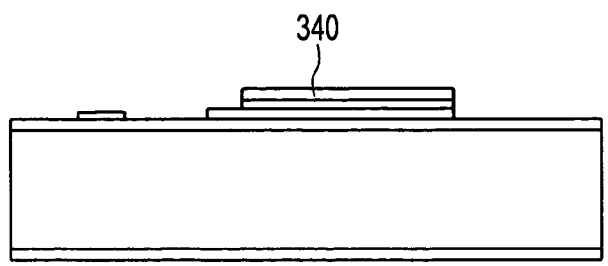
Figure 3I:
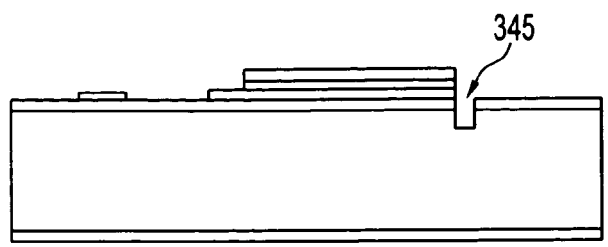
Figure 3J:
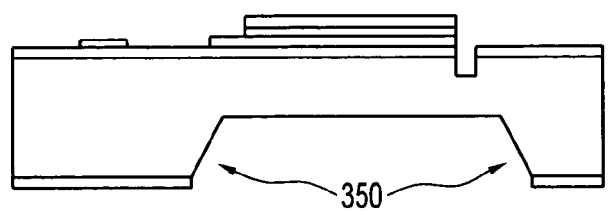
Figure 3K:
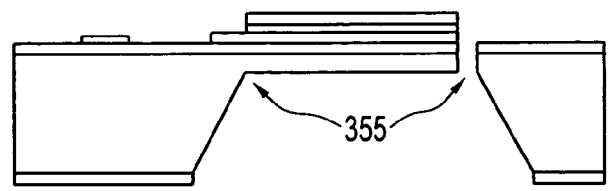

FIGS. 3(j) and 3(k) illustrate the bulking of silicon etching (dry (DRIE) or wet (anisotropic alkaline solution)). Either wet anisotropic etching or dry isotropic etching can be adopted to remove the bulk silicon to form the cantilever. Regarding wet etching, the alkaline solutions, like TMAH and KOH can be used to form a pyramidal-shaped hole 350 with the angle of wall about 54.7 degree. The etching depth is controlled by monitoring etching rate and the etching process and can be stopped 355 based on the final thickness of cantilever desired, e.g. 5~30 micron. Such process is a low-cost method with weak etching thickness control. Regarding dry etching, such as DRIE, the angle of the wall could be approximately 90 degrees. Such process can precisely control the etching process, e.g. etch depth, and shrink the die size, but with high cost. After this process step, a cantilever with top and bottom electrode, functional materials PZT, supporting dielectric layer comes into being.

Figure 3L:
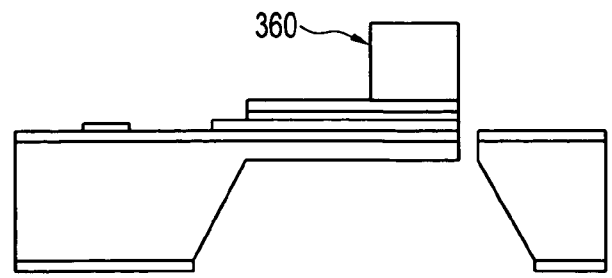

FIG. 3(l) illustrate the formation of an end mass 360 (manually place or thick PR process integration). With the end mass on the free tip of the cantilever, induced cantilever vibration amplitude will be dramatically increased, realizing much larger strain in the beam thus more power output; and vibration frequency will be tuned significantly, giving sufficient room to the design to season the resonant frequency matching the target environmental frequency. End mass could be manually placed onto the tip with certain mass made in advance by metal or other stuff, or in-situ integrated into the process flow for making the cantilever device mentioned above using advanced thick PR process which employs electroplating process.

The total masks for fabricating the device using process described above could be limited to only 3, meaning that little processing time and vast cost savings can be achieved in a manufacturing cycle. More importantly, such process flow is CMOS compatible which enables potential integration of power source, circuitry, and other function parts to realize system-on-chip.

There are many potential applications for the power generating device described herein, such as:

Industry plant/vehicle/ship/airplane, for example, rotary machines like engine

Home building, for example home appliance in use, and HVAC systems

Ground, for example, transportation automobile induced and or seismic vibrations Others, for example human body, and PC Accordingly, the embodiments provide for a micromachined, piezoelectric power generation system and method for its fabrication. It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A micro-sized power source, comprising:
    a dielectric frame having a cantilever beam, the cantilever beam comprising a piezoelectric panel placed in between a lower electrode pad and an upper electrode pad;
    a silicon wafer positioned between two dielectric layers, said silicon wafer having a top surface and a bottom surface to form said dielectric frame; and
    an end mass formed on the piezoelectric panel, the end mass providing weight to cause the piezoelectric panel to move within the dielectric frame and generate electrical power.

2. The micro-sized power source of claim 1 wherein a movement of the panel within the frame causes a generation of said electrical power used to power a microelectronic system.

3. The micro-sized power source of claim 1 wherein said electrical power is accessed electrically from a connection to the lower electrode pad and upper electrode pad.

4. The micro-sized power source of claim 1 wherein the lower electrode pad and the upper electrode pad comprise at least one of: platinum, titanium, and chromium.

5. The micro-sized power source of claim 1 wherein the lower electrode pad and upper electrode pad are comprised of a thickness in a range of 100 nm to 400 nm.

6. The micro-sized power source of claim 5 wherein said micro-sized power source operates with a low frequency, equal to or less than a 1000 Hz, vibration extracting capability.

7. The micro-sized power source of claim 1 wherein said two dielectric layers comprises a silicon dioxide and silicon nitride.

8. A piezoelectric power generator including:
    a piezoelectric panel including a piezoelectric layer in between upper and lower electrode pads;
    a cantilever beam from a dielectric frame loosely supporting the piezoelectric panel thereon; and an end mass formed on the piezoelectric layer, the end mass providing weight to cause the piezoelectric panel to vibrate within the frame and causes the generation of electrical power.

9. The micro-sized power source of claim 8 wherein a movement of the panel within the frame causes a generation of said electrical power, wherein said electrical power is used to power a microelectronic system.

10. The micro-sized power source of claim 8 wherein electrical power is accessed electrically from a connection to the lower electrode pad and upper electrode pad.

11. The micro-sized power source of claim 8 wherein the lower electrode pad and the upper electrode pad comprise at least one of: platinum, titanium, and chromium.

12. The micro-sized power source of claim 8 wherein the lower electrode pad and upper electrode pad are comprised of a thickness in a range of approximately 100 nm to 400 nm.

13. A method of fabricating a micro-sized power source, comprising:
   forming a dielectric frame comprising a silicon wafer positioned between two dielectric layers, said silicon wafer having a top surface and a bottom surface;
   etching a window into the bottom surface of the dielectric frame, said window etched at a depth enabling the formation of a panel in the form of a cantilever beam;
   forming a bottom electrode pad on the top surface of the dielectric layer of the cantilever beam;
   forming a piezoelectric deposition layer over the bottom electrode pad;
   forming a top electrode pad over the piezoelectric deposition layer;
   forming an end mass at an outer edge over one end of the top electrode;
   wherein movement of the cantilever beam by said end mass causes the generation of electrical power from the piezoelectric deposition layer that can be obtained through the bottom and top electrodes.

14. A method of fabricating a micro-sized power source of claim 13 wherein the lower electrode pad and upper electrode pad are comprised of at least one of: platinum, titanium, and chromium.

15. A method of fabricating a micro-sized power source of claim 13 wherein the lower electrode pad and upper electrode pad are comprised of a thickness in a range of 100 nm to 400 nm.

16. A method of fabricating a micro-sized power source of claim 13 wherein the piezoelectric deposition layer is PZT.

* * * * *